United States Patent [19]
Weinhardt et al.

[11] Patent Number: 5,701,101
[45] Date of Patent: Dec. 23, 1997

[54] CHARGE AMPLIFIER FOR BLAST GAUGES

[75] Inventors: Robert Weinhardt; Allen J. Lindfors, both of Ridgecrest, Calif.; James L. Rieger, deceased, late of Ridgecrest, Calif., by Kent N. Birch, executor

[73] Assignee: The United States of America as Represented by the Secretary of the Navy, Washington, D.C.

[21] Appl. No.: 407,460

[22] Filed: Mar. 20, 1995

[51] Int. Cl.$^6$ ................................................ G06G 7/12
[52] U.S. Cl. ........................ 327/561; 327/335; 327/336; 327/345; 327/509
[58] Field of Search ............................ 327/561, 335, 327/509, 342, 345

[56] References Cited

PUBLICATIONS

"High Accuracy Analog–Differentiation" Nordlund Nov. 1972 The Review of Scientific Instruments, vol. 43, No. 11, 1699–1700.

IBM Tech. Disc. Bul. "Varicap Compensation of Output Amplifiers" vol. 27 No. 11 Apr. 1985 p. 6734.

George A. Philbrick Researches, Inc. 230 Congress St. Boston 10, Mass. Sep. 20, 1952.

*Primary Examiner*—Margaret Rose Wambach
*Attorney, Agent, or Firm*—Melvin J. Sliwka; Stephen J. Church

[57] ABSTRACT

The present invention is a charge amplifier that directly produces a low impedance voltage output proportional to the charge at its input. The invention consists of an operational amplifier, an input capacitor, a feedback capacitor and a feedback resistor in a parallel configuration. The change amplifier of the present invention can be said to be a differentiator followed by an integrator so that the "noisy" differentiation process precedes the integration and, thus the integration produces less signal degradation.

7 Claims, 1 Drawing Sheet

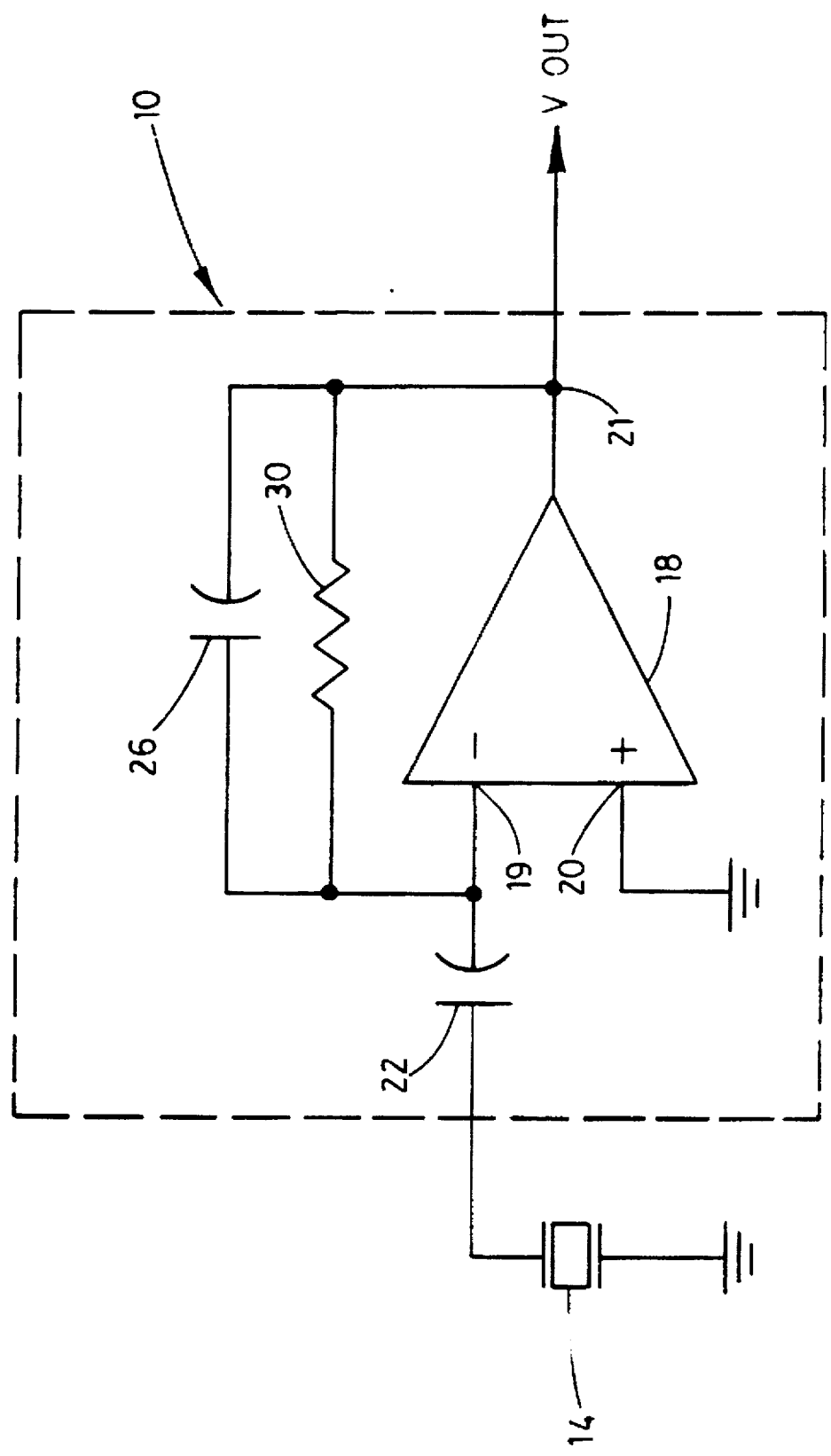

CHARGE AMPLIFIER FOR BLAST GAUGES

FIELD OF THE INVENTION

The present invention relates to electronic amplifiers and more particularly to an electronic charge amplifier directly producing a voltage output proportional to the charge input of a blast gauge or other charge producing transducer.

BACKGROUND OF THE INVENTION

Blast gauges and certain other transducers produce as their output a charge rather than a voltage or current proportional to some input stimulus. Signal conditioning circuitry is used to convert the input charge, or a manifestation of it, into a voltage for instrumentation use. Present systems use a method of integration of the current produced by the charge, but because of the mathematical limitations of integration have less than the described high-frequency response to the transient input phenomena. If an integrator is used as the load to a charge-generating transducer as is present practice, the information provided at the output is the integral of the data desired. The output data must, therefore, be differentiated to produce the "real data." Differentiation is, however, a "noisy" process and is to be avoided if at all possible. Prior art charge amplifiers which integrate blast gauges, in particular, require processing which preserves the transient nature of the data and very fast risetimes, which would otherwise be degraded by long cable runs and parasitic capacitances.

SUMMARY OF THE INVENTION

The present invention is a charge amplifier that directly produces a low impedance voltage output proportional to the charge at its input. The present invention may suitably comprise, consist of, or consist essentially of an operational amplifier, an input capacitor, a feedback capacitor and a feedback resistor. The low impedance voltage output is limited only by the characteristics of the operational amplifier used. The invention requires the use of a feedback capacitance and a feedback resistance in parallel connected between the input to and the output from the operational amplifier. A feedback resistor $R_f$ connected between the input and output of the operational amplifier provides DC stability by providing a DC path in the feedback loop for the negative input thus removing DC from the output. A capacitance $C_i$ connected in series between the charge source and the input to the operational amplifier presents the ideal load to the charge input. $C_i$ is selected to be as small as possible for a given charge source, to minimize charge time and the effect of non-zero source resistance. The feedback capacitor $C_f$ is then selected to obtain the desired charge gain $C_i/C_f$ for the circuit. The invention handles transient signal inputs and has a bandwidth down to that set by the resistor $R_f$ such that $$f = \frac{1}{2\pi R_f C_f}.$$

As mentioned above, presently used charge amplifiers are configured as integrators, thus the information provided at the output is the integral of the data desired, hence the output data must be differentiated to produce the "real" data. Differentiation is a noisy process and should be avoided, if at all possible. The charge amplifier of the present invention can be said to be a differentiator followed by an integrator so that the "noisy" differentiation process precedes the integration and, therefore, the integration produces less signal degradation.

It is thus an object of the present invention to provide an electronic circuit for processing the electrical charge output of a blast gauge or other charge producing transducer to produce a corresponding proportional voltage output.

It is yet another object of the present invention to provide an electronic circuit for processing the electrical charge output of a blast gauge or other charge producing transducer preserving the transient nature of the blast or other transient data produced and the very fast risetimes from degradation by long cable runs and parasitic capacitances.

It is still another object of the present invention to provide an electronic circuit which amplifies and converts the charge output of a blast gauge or other charge producing transducer to a low impedance voltage suitable for driving coaxial transmission lines.

It is further another object of the present invention to provide an electronic means of converting an electronic charge input into a corresponding voltage output proportional to said charge at its input, and limited only by the characteristics of the converting means.

It is finally another object of the present invention to provide an electronic circuit for processing the electrical charge output of a blast gauge or other charge producing transducer into a corresponding voltage wherein said circuit is compact and unaffected by temperature and power supply variations.

BRIEF DESCRIPTION OF THE DRAWINGS

The FIGURE is a schematic diagram of the present invention.

DETAILED DESCRIPTION

With reference to the drawing, it will be seen that the charge amplifier 10 is comprised of the operational amplifier 18 which has a negative input terminal 19 and a positive input terminal 20. The operational amplifier 18 is a means for producing a voltage output as a function of charge input from the charge source 14. The input capacitor 22 employed as a charge storage means has its negative plate connected to the negative input terminal 19 and its positive plate connected to the charge source 14 which may be a blast gauge or equivalent charge producing means. The feedback capacitor 26 is connected in parallel with the feedback resistor 30 between the negative input 19 and the output terminal 21 of the operational amplifier 18. The parallel feedback arrangement of capacitor 26 and resistor 30 is the means for controlling operational amplifier 18 and producing a proportionality factor in conjunction with input capacitor 22 for the function defining the direct proportional relationship between the charge input and the voltage output of said operational amplifier 18.

Component values and the characteristics of the operational amplifier 18 are determined by the intended use. The capacitors 22 and 26 are other than electrolytic types. The charge source 14 sees as its load the input capacitor 22 in parallel with some capacitance to ground in the line between the charge source 14 and the charge amplifier 10. Since this line capacitance can not be precisely known, and to obtain the greatest accuracy, the value of $C_i$ must be much larger than the line capacitance. In one emodiment a value of 0.1 µF is selected for $C_i$. The load seen by the charge source 14 will then be at least a few thousand times that of the likely line capacitance. The desired output voltage then determines the value of $C_f$ in accordance with the equation $$V_{out} = \left(\frac{C_i}{C_f}\right) \times q_{in}. \text{ For a } \frac{V_{out}}{q_{in}} \text{ value of } \frac{1 \text{ volt}}{12 \text{ coulomb}} \text{ selected}$$

in relation to a particular charge source 14 to be used the value of $C_f$ would be $$C_f = \frac{C_i q_{in}}{V_{out}} = \frac{100,000}{12} = 8300 \text{ pF}.$$

For applications where the desired output voltage is 5V, such as where telemetry is going to be used and the 0 to 5 volt DC range common to telemetry is a factor, the operational amplifier's characteristics are used to determine the response time. The two characteristics of the amplifier that determine the response time for a given load are the maximum output current and output voltage slew rate. Limiting the output current of the operational amplifier 18 to 20 mA, the charge amplifier 10 is current limited as it charges the feedback capacitor 26. From the definition of a capacitor $$i_t = C\frac{dv}{dt} \text{ and } q = Cv, \text{ so } q = CV = \int_0^t i(t) \, dt$$

With current limiting it is a constant 20 mA. At equilibrium, when charging stops, then $$t = \frac{Cv}{i} = \frac{8300 \times 10^{-12} \times 5}{20 \times 10^{-3}} = 2.075 \, \mu sec$$

and for the amplifier output to change voltages at a rate which slows the process no further, output slew rate must be greater than $$\frac{5 \text{ V}}{2.075 \, \mu sec} = \frac{2410 \text{ mV}}{msec}$$

which can also be expressed in terms of full-power bandswidth of approximately $$BW \approx \frac{1}{2\pi \frac{t_r}{2.2}} = 150 \text{ kHz}.$$

This bandwidth approximation comes from the definition of risetime taken as the time between the 10% and 90% responses of the pulse, which in a slew-rate-limited system would be close to 80% of the time of the full rise.

The amplifier selected for this emodiment of the invention is the Elantec EL2073 which has a unity gain of 400 MHz and a gain-bandwidth product at any gain of 200 MHz. Gain to a 1 MHz signal is several hundred, assuring that the feedback circuit necessary for accuracy is stiff enough to act quickly when the input changes abruptly. A two-volt step on the output when loaded by a 50-ohm output cable and series resistor responds at a rate of at least $$\frac{175 \text{ v}}{\mu sec},$$

thus rising fast enough for 40 ns pulses to be resolved at full amplitude.

OPERATION

With reference to the drawing when charge from the charge source 14 enters the charge amplifier 10 a current flows from the charge source 14 to the input capacitor 22. The charging of input capacitor 22 drives the negative input terminal 19 of the operational amplifier 18 more negative. The output of the operational amplifier 18, which was initially zero due to the feedback loop created by $R_f$ and the grounded positive input terminal 20 of the operational amplifier 18, is driven negative by the difference in potential between the negative input terminal 19 and the positive input terminal of the operational amplifier 18. Impedance and gain of the operational amplifier 18 are near infinite so the voltage level at the output terminal 21 of the operational amplifier 18 falls causing the charging of feedback capacitor 26. This forces the voltage at the negative input terminal 19 back to zero. The feedback circuit consisting of feedback capacitor 26 and feedback resistor 30 causes the negative input terminal 19 to be maintained at zero potential so the input charge is always stored across the feedback capacitor 26. Since Q=CV, if the side of the input capacitor 22 connected to the negative input terminal 19 is held at zero potential, the input capacitor 22 charges to the input charge level and amplification and conversion to the charge equivalent voltage is obtained. The output voltage from the charge amplifier 10 thus behaves as a voltage source.

The structures and methods disclosed herein illustrates the principles of the present invention. The invention may be embodied in other specific forms without departing from its spirit or essential characteristics. The emodiments of the invention described herein are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

What is now claimed:

1. A device for connection between a charge-producing transducer and instrumentation, said device for directly producing a voltage output proportional to charge at its input, said device comprising:

a means for storing charge from said transducer, said means having an input and an output, said means having its input connected to said charge-producing transducer;

means connected to the output of said storing means for producing a voltage output as a function of charge input; and, means connecting between the output of said storing means and the output of said producing means for controlling said producing means and producing a proportionality factor in conjunction with said storing means for a function defining the direct proportional relationship between the charge input and the voltage output of said producing means.

2. The device of claim 1 wherein said means for storing charge is a non-electrolytic capacitor having a capacitance much greater than the capacitance of the connection between said charge-producing transducer and said storing means.

3. The device of claim 1 wherein said means for storing charge is selected to appear to said charge-producing transducer as a capacitance of at least several thousand times that of the capacitance of the connection between the charge-producing transducer and said means for storing charge.

4. The device of claim 1 wherein said means for producing a voltage output as a function of charge input is an operational amplifier selected to have a maximum output current and output voltage slew rate to produce the desired response time for the charge output of said charge-producing transducer.

5. The device of claim 1 wherein said means for controlling said producing means and producing a proportionality factor is a feedback resistor and a feedback capacitor connected in parallel with each other and in parallel with said producing means.

6. A circuit for generating an output voltage having a desired proportionality to a variable charge, the circuit comprising:

a transducer developing the charge and having a ground terminal and an opposite terminal;

an input capacitor having a first terminal and an opposite second terminal;

a transmission line directly connecting said opposite terminal of the transducer to said first terminal, said transmission line having a capacitance to ground;

a operational amplifier having an input terminal and having an output terminal of the circuit, said input terminal being directly connected to said second terminal of said input capacitor;

a feedback capacitor directly connected between said input terminal and said output terminal; and a resistor connected in parallel with said feedback capacitor between said input terminal and said output terminal, wherein:

said input capacitor has a capacitance much greater than said capacitance to ground;

said feedback capacitor has a capacitance equal to the product of the capacitance of said input capacitor and the desired proportionality of said variable charge to said output voltage; and said resistor has a resistance selected to remove DC voltage from said output terminal, so that the circuit provides said desired output voltage at said output terminal.

7. The circuit of claim 6 wherein said input capacitor has a capacitance at least several thousand times said capacitance to ground.

* * * * *